(12) United States Patent
Li

(10) Patent No.: US 10,784,321 B2
(45) Date of Patent: Sep. 22, 2020

(54) METHOD FOR MANUFACTURING OLED DEVICE, OLED DEVICE AND DISPLAY PANEL

(71) Applicant: BOE TECHNOLOGY GROUP CO., LTD., Beijing (CN)

(72) Inventor: Xiaohu Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 43 days.

(21) Appl. No.: 15/867,164

(22) Filed: Jan. 10, 2018

(65) Prior Publication Data

US 2018/0331165 A1    Nov. 15, 2018

(30) Foreign Application Priority Data

May 15, 2017   (CN) .......................... 2017 1 0338338

(51) Int. Cl.
*H01L 27/32* (2006.01)
*H01L 51/52* (2006.01)

(52) U.S. Cl.
CPC ...... *H01L 27/3246* (2013.01); *H01L 27/3209* (2013.01); *H01L 51/5203* (2013.01)

(58) Field of Classification Search
None
See application file for complete search history.

(56) References Cited

U.S. PATENT DOCUMENTS

| 2004/0090178 A1 | 5/2004 | Chuang |
| 2009/0212303 A1 | 8/2009 | Toerker et al. |
| 2010/0252857 A1* | 10/2010 | Nakatani ............. H01L 27/3246 257/100 |
| 2017/0133620 A1* | 5/2017 | Lee ...................... H01L 51/5212 |
| 2018/0204892 A1* | 7/2018 | Sakamoto ........... H01L 27/3246 |

FOREIGN PATENT DOCUMENTS

| CN | 1738495 A | 2/2006 |
| CN | 101855742 A | 10/2010 |
| CN | 103887443 A | 6/2014 |
| CN | 106067478 A | 11/2016 |
| CN | 106449701 A | 2/2017 |

OTHER PUBLICATIONS

First Office Action on CN Application No. 201710338338.1, dated May 8, 2019, 23 pages with translation.

* cited by examiner

*Primary Examiner* — Nicholas J Tobergte
*Assistant Examiner* — Kien C Ly
(74) *Attorney, Agent, or Firm* — Dinsmore & Shohl LLP

(57) ABSTRACT

The present disclosure relates to a method for manufacturing an OLED device, an OLED device and a display panel. The method for manufacturing the OLED device comprises: forming a first electrode layer on a substrate; forming at least one layer of inorganic film at a position on the first electrode layer corresponding to a pixel defining layer; breaking a first organic layer at an etching angle of the at least one layer of inorganic film when forming the first organic layer; forming the pixel defining layer on the inorganic film; forming the first organic layer on the first electrode layer, the inorganic film and the pixel defining layer; and forming a light emitting layer, a second organic layer and a second electrode layer in this order on the first organic layer.

14 Claims, 3 Drawing Sheets

METHOD FOR MANUFACTURING OLED DEVICE, OLED DEVICE AND DISPLAY PANEL

CROSS-REFERENCE TO RELATED APPLICATION

This application claims priority to Chinese Patent Application No. 201710338338.1, filed on May 15, 2017, which is incorporated herein by reference and used for all purposes.

TECHNICAL FIELD

The present disclosure relates to a method for manufacturing an OLED device, an OLED device and a display panel.

BACKGROUND

In recent years, OLED (Organic light-Emitting Diode) display technology as a novel flat panel display technology gradually has received more and more attention. Since the OLED display Panel has the characteristics such as active luminescence, high luminous brightness, high resolution, wide angle of view, fast response, low energy consumption and flexibility, it becomes the next generation display technology that may replace the liquid crystal display.

SUMMARY

According to an aspect of the present disclosure, a method for manufacturing an OLED device is provided. The method may comprise forming a first electrode layer on a substrate; forming at least one layer of inorganic film at a position on the first electrode layer corresponding to a pixel defining layer; breaking a first organic layer break at an etching angle of the at least one layer of inorganic film when forming the first organic layer; forming the pixel defining layer on the inorganic film; forming the first organic layer on the first electrode layer, the inorganic film and the pixel defining layer; and forming a light emitting layer, a second organic layer and a second electrode layer in this order on the first organic layer.

In an illustrative embodiment of the present disclosure, breaking a first organic layer break at an etching angle of the at least one layer of inorganic film when forming the first organic layer comprises adjusting the etching angle of the one or more layers of inorganic film through etching.

In an illustrative embodiment of the present disclosure, the inorganic film is a silicon nitride film or a silicon oxide film.

In an illustrative embodiment of the present disclosure, the first organic layer comprises a hole injection layer and a hole transport layer, and wherein the hole injection layer breaks at the etching angle when forming the hole injection layer.

In an illustrative embodiment of the present disclosure, forming the pixel defining layer on the inorganic film comprises: patterning the pixel defining layer to form a plurality of openings and a plurality of pixel spacers.

In an illustrative embodiment of the present disclosure, the etching angle is in a range of about 70 degrees to about 135 degrees.

According to one aspect of the present disclosure, an OLED device is provided. The OLED device may comprise: a substrate; a first electrode layer disposed on the substrate; at least one layer of inorganic film disposed on the first electrode layer, wherein the inorganic film has a preset etching angle; a pixel defining layer disposed on the one of more layers of inorganic film; a first organic layer disposed on the first electrode layer, the inorganic film and the pixel defining layer, and breaking at the preset etching angle of the inorganic film; and a light emitting layer, a second organic layer, and a second electrode layer disposed in this order on the first organic layer.

In an illustrative embodiment of the present disclosure, the inorganic film is a silicon nitride film or a silicon oxide film.

In an illustrative embodiment of the present disclosure, the preset etching angle is in a range of about 70 degrees to about 135 degrees.

In an illustrative embodiment of the present disclosure, the first electrode layer is an indium tin oxide/silver/indium tin oxide composite layer.

According to one aspect of the disclosure, a display panel is provided. The display panel may comprise the OLED device according to any of the above mentioned.

It should be understood that, the above general description and the detailed description thereafter are only illustrative and explanatory, and cannot limit the present disclosure.

BRIEF DESCRIPTION OF THE DRAWINGS

The accompanying drawings herein are incorporated into the description and constitute a part of the description, show embodiments of the present disclosure and are used for explaining the principle of the present disclosure together with the description. Evidently, the accompanying drawings described below are merely some embodiments of the present disclosure, and persons of ordinary skill in the art may also obtain other drawings according to these accompanying drawings without creative efforts.

DETAILED DESCRIPTION

Figure 1:
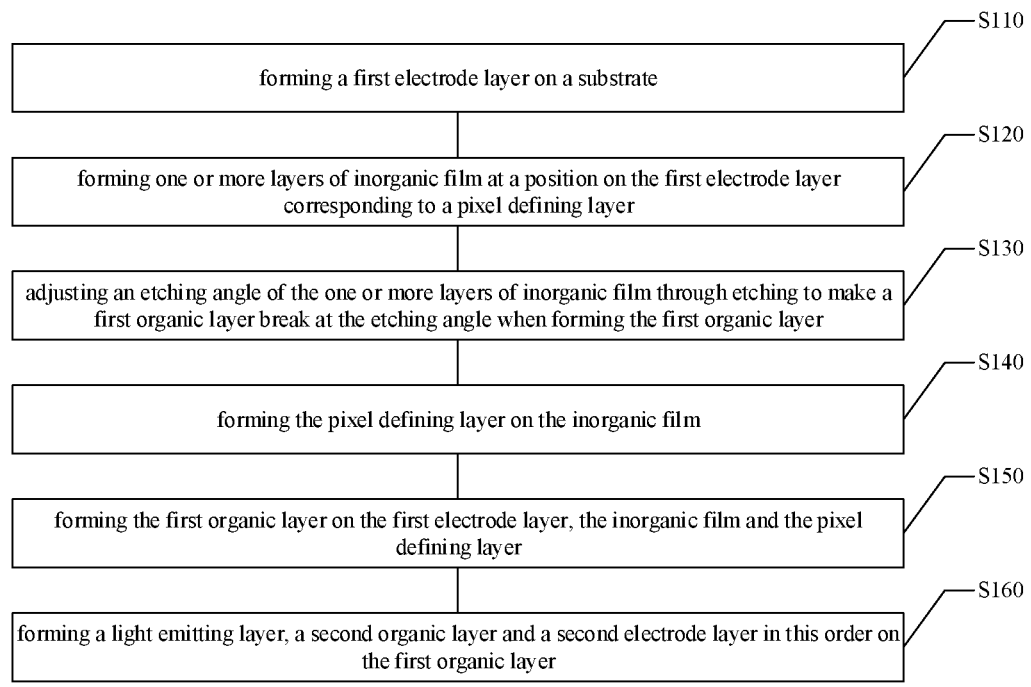
FIG. 1 is a flowchart schematically showing a method for manufacturing an OLED device according to an illustrative embodiment of the present disclosure.

The illustrative embodiments are now described more comprehensively with reference to the accompanying drawings. However, the illustrative embodiments can be implemented in many forms and should not be understood to be limited to examples described herein. Instead, the provision of these embodiments will make the disclosure more comprehensive and complete, and the ideas of the illustrative embodiments are communicated comprehensively to those skilled in the art. The features, structures, or characteristics described can be combined in one or more embodiments in any appropriate way. In the following description, many concrete details are provided for thorough understanding of the embodiments of the present disclosure. However, those skilled in the art would appreciate that, the technical solutions of the present disclosure can be carried out with one or more of the concrete details omitted, or that other methods, components, devices, steps, and etc. can be used. In other cases, well known technical solutions are not shown or described in detail to avoid obscuring various aspects of the disclosure.

For the sake of description, spatial relation terms such as "below . . . ", "under . . . ", "bottom", "above . . . " and "top", can be used herein to describe a relationship between an element or feature as shown in the figure with another element or feature (or other elements or features). It should be understood that, the spatial relation terms are intended to include different orientations of the device in use or in operation than the one shown in the figure. For example, if the device in the figure is reversed, the element described as "below" or "under" the other element or feature will be positioned "above" the other element or feature. Therefore, the exemplary term "below . . . " may include both orientations of "above . . . " and "below . . . ". The device can be additionally oriented (rotated by 90 degrees or in other orientations), and the spatial relation descriptor used herein is interpreted accordingly.

The terms used herein are intended only to describe the illustrative embodiments but not to limit the invention. As used herein, the singular form "a", "an", "the" and their variants are intended to also include a plural form unless otherwise clearly indicated in the context. It should be further understood that, the term "comprise" and/or "include", when used in the application document, specifies the existence of the characteristic, integrity, step, operation, element, and/or member, but does not exclude the existence or addition of more than one other characteristic, integrity, step, operation, element, member, and/or a combination thereof.

In addition, the accompanying drawings are merely schematic diagrams of the present disclosure, and are not necessarily drawn in scale. The same reference signs in the drawings indicate the same or similar composite parts, and thus repeated descriptions thereof are omitted. Some of the block diagrams shown in the drawings are functional entities and do not necessarily correspond to physically or logically independent entities. These functional entities can be implemented in the form of software, or implemented in one or more hardware modules or integrated circuits, or implemented in different networks and/or processor devices and/or microcontroller devices.

The OLED display panel includes subpixels of different colors (such as RGB three colors) arranged in an array. When evaporating various OLED devices in the OLED display panel, the hole injection layer (HIL) and the hole transport Layer (HTL) are often evaporated through the mask. At present, the transverse transfer rate of carriers in the hole injection material used by the evaporation is higher, and the lighting voltage between the subpixels of different colors has a larger difference (e.g., pressure difference), which easily results in directional transfer of the carriers, such that subpixels of other colors are simultaneously lighted. In this way, in a high resolution display screen, crosstalk between the RGB three colors occurs extremely easily.

Therefore, it is needed to provide a method for manufacturing an OLED device and an OLED device capable of solving one or more of the problems mentioned above.

In the present illustrative embodiment, a method for manufacturing an OLED device is provided. By referring to FIG. 1 and FIG. 2, the method for manufacturing the OLED device comprises the following steps.

In step S110, a first electrode layer 220 is formed on a substrate 210.

In step S120, at least one layer of inorganic film 230 are formed at a position on the first electrode layer 220 corresponding to a pixel defining layer 240.

In step S130, an etching angle of the at least one layer of inorganic film 230 is adjusted through etching to make a first organic layer 250 break at the etching angle when forming the first organic layer 250.

In step S140, the pixel defining layer 240 is formed on the inorganic film 230.

In step S150, the first organic layer 250 is formed on the first electrode layer 220, the inorganic film 230 and the pixel defining layer 240.

In step S160, a light emitting layer 260, a second organic layer 270 and a second electrode layer 280 are formed in this order on the first organic layer 250.

In the method for manufacturing the OLED device according to the illustrative embodiment, on the one hand, at least one layer of inorganic film is added below the pixel defining layer such that the first organic layer breaks at the etching angle of the inorganic film, which can avoid the carriers in the first organic layer from transversely transferring between the pixels, and reduce the crosstalk between RGB pixels; and on the other hand, since the inorganic film layers were added before the start of the evaporation process, interferences to the evaporation process can be reduced.

The method for manufacturing the OLED device according to the illustrative embodiment will be described below in detail.

In step S110, a first electrode layer 220 is formed on a substrate 210.

In the illustrative embodiment, the first electrode may serve as an anode to provide holes, and the first electrode layer may be formed on the substrate, and the substrate may include a switch device and an insulating layer and etc. The first electrode layer can be different depending on the type of OLED device, for example, when the OLED device emits light from the bottom, the first electrode layer is a transparent electrode layer, and when the OLED device emits light from the top, the first electrode layer is a reflective electrode layer, and this is not specially limited in the present disclosure.

Further, when the first electrode layer is a transparent electrode layer, the first electrode layer can be formed by using a transparent conductive material with a relatively large power function, such as indium tin oxide (ITO), zinc tin oxide (ZTO), indium zinc oxide (IZO), zinc oxide, gallium indium zinc oxide (GIZO) and so on. In addition, in this illustrative embodiment, the first electrode layer can also be a composite layer comprising a transparent conductive material layer and a metal layer, e.g., an indium tin oxide/silver/indium tin oxide composite layer, i.e., ITO/Ag/ITO composite layer.

In step S120, at least one layer of inorganic film 230 is formed at a position on the first electrode layer 220 corresponding to a pixel defining layer 240.

In this illustrative embodiment, at least one layer of inorganic film can be formed at a position on the first electrode layer corresponding to the pixel defining layer, i.e., below the pixel defining layer. The at least one layer of inorganic film can be a silicon nitride (SiN) film or a silicon oxide (SiO) film, but the inorganic film in the illustrative embodiment of the present disclosure is not limited to it, for example, the inorganic film can also be an inorganic film such as a titanium oxide film, which also falls within the scope of protection of the present disclosure.

In this illustrative embodiment, the at least one layer of inorganic film can be formed on the first electrode layer by using processes such as chemical vapor deposition, chemical plating, and the at least one layer of inorganic film can be formed on the first electrode layer also by using sputtering deposition, physical vapor deposition or the like, and the present disclosure does not specially limit it.

Next, in step S130, an etching angle of the at least one layer of inorganic film 230 is adjusted through etching to make a first organic layer 250 break at the etching angle when forming the first organic layer 250.

In this illustrative embodiment, the etching angle can be an angle between a plane where a sidewall of the inorganic film layer is in and a plane where the first electrode layer is in, and if the sidewall of the inorganic film layer is a curved surface, then the etching angle may be an angle between a tangent plane of the sidewall of the inorganic film layer and the plane where the first electrode layer is in.

Figure 2:
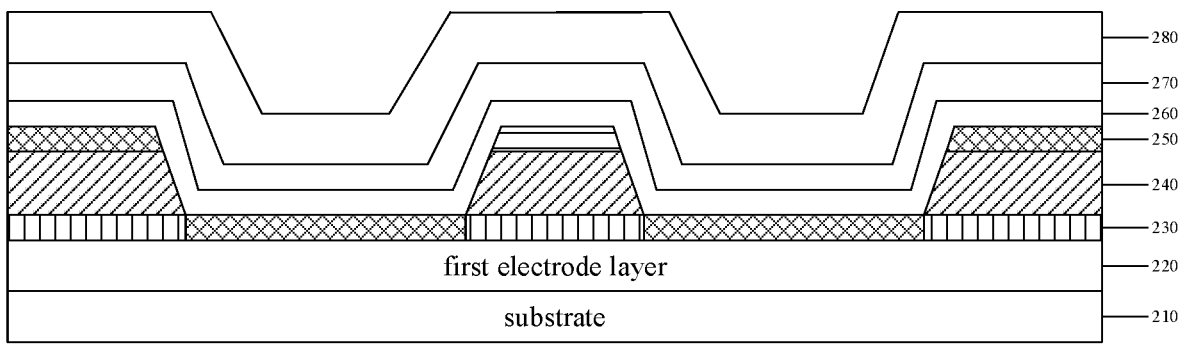
FIG. 2 is a schematic diagram schematically showing an OLED device structure according to an illustrative embodiment of the present disclosure.

In the illustrative embodiment, the etching angle of the at least one layer of inorganic film can be adjusted through etching to make the first organic layer break at the etching angle when forming the first organic layer. By referring to FIG. 2, the gridline filling portion in FIG. 2 is the first organic layer 250, and the vertical line filling portion is the inorganic film layer 230. As can be seen from FIG. 2, the first organic layer 250 breaks at the etching angle of the inorganic film layer 230.

Figure 3:
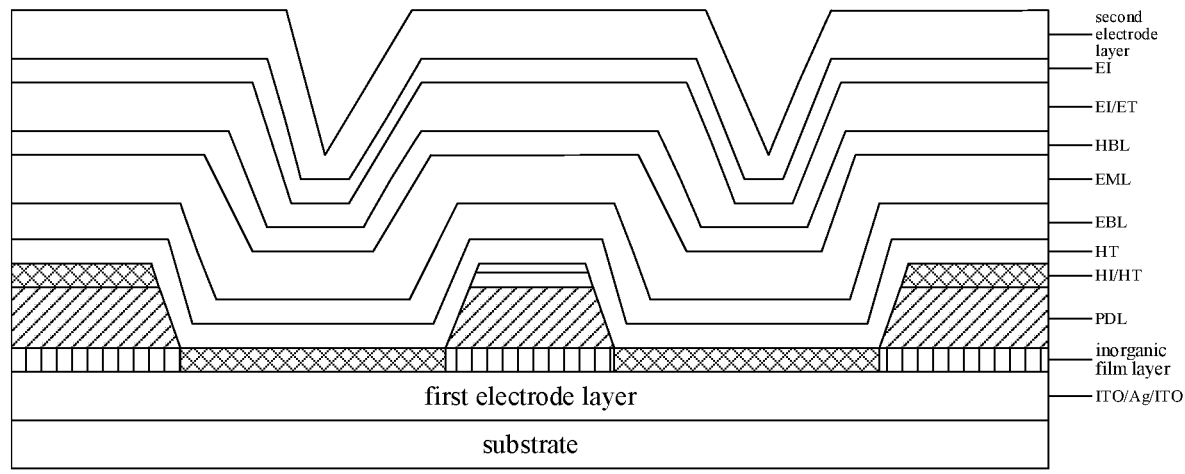
FIG. 3 is a schematic diagram schematically showing an OLED device structure according to another illustrative embodiment of the present disclosure.
Figure 4:
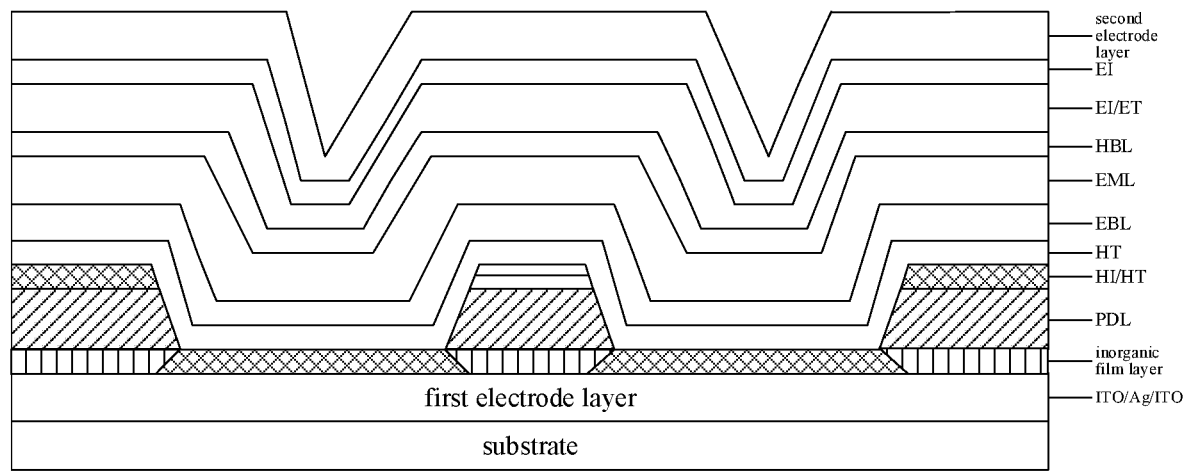
FIG. 4 is a schematic diagram schematically showing an OLED device structure according to another illustrative embodiment of the present disclosure.

In this illustrative embodiment, when the etching angle is in a range of about 70 degrees to about 135 degrees, the first organic layer can break at the etching angle. FIG. 3 is a schematic diagram of the OLED device structure when the etching angle of the inorganic film layer is 90 degrees. FIG. 4 is a schematic diagram of the OLED device structure when the etching angle of the inorganic film layer is larger than 90 degrees. The etching angle is an angle between the plane where the sidewall of the inorganic film layer is in and the plane where the first electrode layer is in.

Next, in step S140, the pixel defining layer 240 is formed on the inorganic film 230.

In this illustrative embodiment, a pixel defining material layer can be formed on the first electrode layer. The pixel defining material layer is patterned by a patterning process to form a pixel defining layer comprising a plurality of openings and pixel spacers, wherein each opening corresponds to each or a plurality of pixel regions, and the pixel spacers surround to form the plurality of openings. The patterning process in this illustrative embodiment can include at least processes such as exposure, development, etching (wet etching, or dry etching) and the like.

Next, in step S150, the first organic layer 250 is formed on the first electrode layer 220, the inorganic film 230 and the pixel defining layer 240.

In this illustrative embodiment, the first organic layer can include a hole transport layer (HTL). In this case, due to a large etching angle of the inorganic film layer, the HTL will break at the etching angle, which can avoid transverse transfer of the carriers in the HTL layer, and thereby avoid the crosstalk between the RGB pixel structure. HTL can be formed by using hole transport materials such as 4,4'-bis[N-(1-naphthyl)-N-phenylamino] biphenyl (NPB), N,N'-diphenyl-N,N'-bis(3-methylphenyl)-1,1'-biphenyl-4,4-diamine (TPD), N,N'-di-1-naphthyl-N,N'-biphenyl-1,1'-diphenyl-4,4'-diamine (NPD), N-phenyl carbazole, polyvinyl carbazole, or a mixture thereof. HTL can be obtained by processes such as vacuum evaporation process, heat evaporation process, slit coating process, spin coating process and printing process.

Further, in this illustrative embodiment, the first organic layer can further include a hole injection layer (HIL) below the HTL. In this case, due to a large etching angle of the inorganic film layer, the HTL will break at the etching angle, which can avoid transverse transfer of the carriers in the HIL layer, and thereby avoid the crosstalk between the RGB pixel structure. The hole injection layer HIL can facilitate hole injection from the first electrode layer to the HTL. HIL can be formed using hole injection materials such as copper phthalocyanine (CuPc), poly(3,4-ethylenedioxythiophene) (PEDOT), polyaniline (PANT), or a mixture thereof. HIL can be obtained by processes such as vacuum evaporation process, heat evaporation process, slit coating process, spin coating process and printing process.

In addition, in this illustrative embodiment, by referring to FIG. 3 and FIG. 4, the first organic layer can further include an electronic blocking layer EBL. In order to prevent the electrons from passing over the light-emitting layer EML into the hole transport layer HTL to cause quenching, the electron blocking layer EBL can be added between the light-emitting layer EML and the hole transport layer HTL, such that some electrons are detained in light-emitting layer EML and form excitons with the injected holes in light-emitting layer EML, to improve the luminous efficiency.

Figure 5:
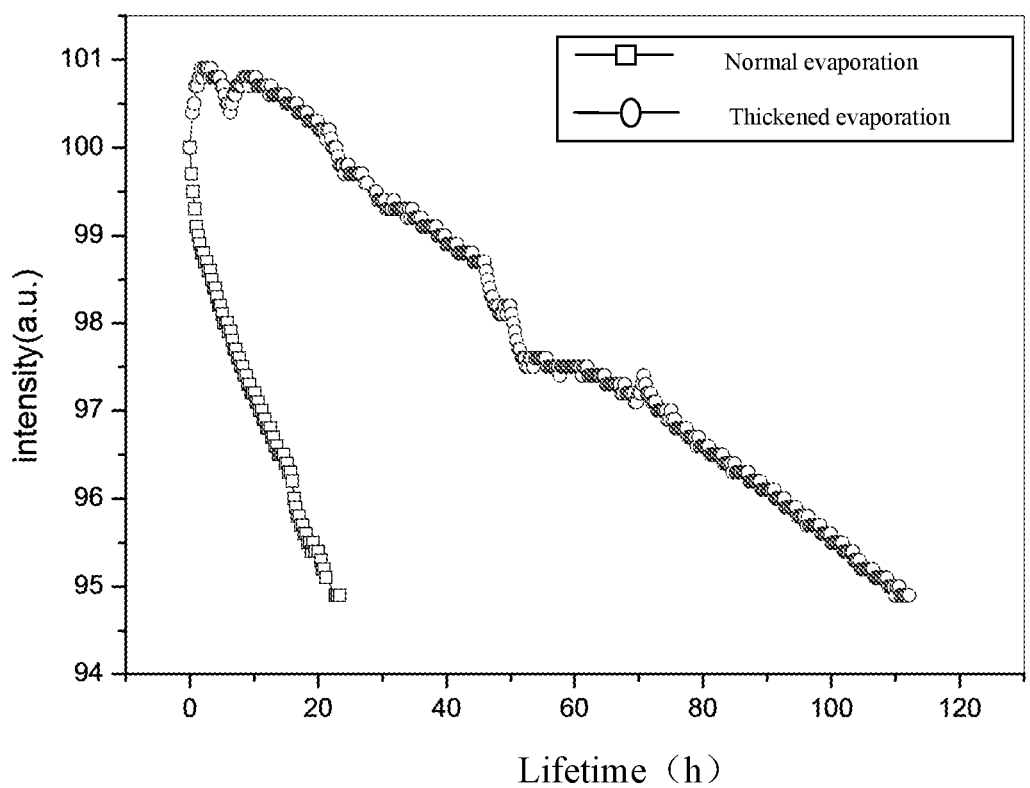
FIG. 5 is a schematic diagram schematically showing OLED device lifetime corresponding to different first organic layer HI/HT thicknesses according to an illustrative embodiment of the present disclosure.

Further, as shown in FIG. 5, the horizontal axis in FIG. 5 represents the device lifetime, the longitudinal axis represents the evaporation intensity, the curve in which the dots are blocks represents a relationship between the device lifetime and the evaporation intensity in the case of a normal evaporation thickness, and the curve in which the dots are circles represents a relationship between the device lifetime and the evaporation intensity after increasing the HI/HT thickness. As shown in FIG. 5, a different thickness of the first organic layer has a great impact on the performance of OLED device, and increasing the thickness of the first organic layer can greatly improve the lifetime of OLED devices, but increasing the thickness of the first organic layer increases the risk of RGB crosstalk in the OLED display screen. Therefore, in this illustrative embodiment, by adding at least one layer of inorganic film on the substrate before evaporating the first organic layer of the OLED, the transverse flow of the carriers between RGB pixels can be blocked during subsequent evaporation processes, thus avoiding crosstalk between RGB pixel units of the OLED device.

Next, in step S160, a light emitting layer 260, a second organic layer 270 and a second electrode layer 280 are formed in this order on the first organic layer 250.

It should be noted that the method described above is merely an exemplary example, and the scope of the present invention is not limited by the exemplary example, but is only defined by the appended claims and equivalents thereof. Various steps may be omitted or may be substituted by equivalent steps. In addition, the steps may be performed in an order different from what is described in the present disclosures.

In this illustrative embodiment, the light-emitting layer EML can include a red light-emitting layer R-EML, a green light-emitting layer G-EML, and a blue light-emitting layer B-EML. The EML can be formed using a suitable luminescent material for producing red light, green light, or blue light, depending on the luminescence mechanism of EML, e.g., fluorescent mechanism or phosphorescent mechanism. The light-emitting layer EML can be obtained by a printing process including inkjet, rotary or nozzle printing process, or a transfer printing process in which the main substrate is subjected to heat or laser.

In this illustrative embodiment, the second organic layer can include an electron transport layer (ETL). The ETL can be formed by using tris-(8-hydroxyquinolinato)aluminum (III) (Alq3), 2-(4-biphenylyl)-5-4-tert-butylphenyl-1,3,4-oxadiazole (PBD), bis(2-methyl-8-hydroxyquinolinato)-4-phenyl phenolato-aluminum (BAlq), 2,9-dimethyl-4,7-diphenyl-1,10-phenanthroline (BCP). The above compounds can be used alone or in the form of a mixture thereof.

Further, in this illustrative embodiment, the second organic layer can further include an electron injection layer EIL on the ETL. The electron injection layer EIL can be formed by alkali metal, alkaline earth metal, fluorides of these metals, oxides of these metals and etc. The materials can be used alone or in the form of a mixture thereof.

In addition, in this illustrative embodiment, the second organic layer may further include a hole blocking layer HBL, as shown in FIG. 3 and FIG. 4. Since the mobility of holes is greater than that of electrons, in order to prevent the holes from passing over the light-emitting layer EML into the electronic transport layer ETL too rapidly to cause quenching, the hole blocking layer HBL can be added between the light-emitting layer EML and the electron transport layer ETL, such that some holes are detained in light-emitting layer EML and form excitons with the injected electrons in light-emitting layer EML, to improve the luminous efficiency.

In this illustrative embodiment, the second electrode layer can be formed from a transparent conductive material or metal, depending on its type such as a transparent electrode or a reflective electrode. The transparent conductive materials can include ITO, ZTO, IZO, ZnOX, SnOX, GIZO, AZO, etc. The metals can include Ag, Al, Pt, Au, Cr, W, Mo, Ti, PD, or an alloy of these materials. The second electrode layer can be obtained by sputtering process, chemical vapor deposition (CVD) process, atomic layer deposition (ALD) process, vacuum deposition process, printing process and the like.

Furthermore, in the present illustrative embodiment, an OLED device is further provided As shown in FIG. 2, the OLED device may comprise a substrate 210; a first electrode layer 220 disposed on the substrate 210; at least one layer of inorganic film 230 disposed on the first electrode layer 220, wherein the inorganic film 220 has a preset etching angle; a pixel defining layer 240 disposed on one of more layer of inorganic film 240; a first organic layer 250 disposed on the first electrode layer 220, the inorganic film 230 and the pixel defining layer 240, and breaking at the preset etching angle of the inorganic film 230; a light emitting layer 260, a second organic layer 270, and a second electrode layer 280 disposed in this order on the first organic layer 250.

In an illustrative embodiment of the present disclosure, the inorganic film is a silicon nitride film or a silicon oxide film.

In an illustrative embodiment of the present disclosure, the preset etching angle is in a range of about 70 degrees to about 135 degrees.

In an illustrative embodiment of the present disclosure, the first electrode layer is an indium tin oxide/silver/indium tin oxide composite layer.

Furthermore, in the illustrative embodiment, a display panel is further provided. The display panel may comprise an OLED device described according to the above illustrative embodiments. Since the display panel in this illustrative embodiment adopts the OLED device, it at least has all advantages corresponding to the OLED device. In this illustrative embodiment, the display panel can be OLED panel, mobile phone, tablet, television set, monitor, notebook computer, digital camera and any product or component having a display function, and the present disclosure does not specially limit it.

Other embodiments of the present disclosure readily occur to those skilled in the art after considering the description and practicing the invention disclosed herein. The present application intends to cover any variation, usage or adaptive change of the present disclosure, and all these variations, usages or adaptive changes comply with general principles of the present disclosure and contain the common knowledge or customary technical means in the technical field that are not disclosed by the present disclosure. The description and the embodiments are only regarded as illustrative, and the true scope and spirit of the present disclosure are indicated by the claims.

It should be understood that, the present disclosure is not limited to the exact structures described above and shown in the drawings, but can be modified and altered without departing the scope thereof. The scope of the present disclosure is limited only by the accompanied claims.

What is claimed is:

1. A method for manufacturing an OLED device comprising:
   forming a first electrode layer on a substrate;
   forming at least one layer of inorganic film at a position on the first electrode layer corresponding to a pixel defining layer;
   forming the pixel defining layer on the at least one layer of inorganic film;
   after forming the at least one layer of inorganic film and the pixel defining layer, forming a first organic layer directly contacting the first electrode layer at a position not corresponding to the pixel defining layer, and directly contacting the pixel defining layer, wherein the first organic layer is broken at an etching angle of the at least one layer of inorganic film when forming the first organic layer; and
   forming a light emitting layer, a second organic layer and a second electrode layer in this order on the first organic layer.

2. The method according to claim 1, wherein the first organic layer is broken at the etching angle of the at least one layer of inorganic film when forming the first organic layer by etching the etching angle of the at least one layer of inorganic film after forming the at least one layer of inorganic film and before forming the first organic layer.

3. The method according to claim 1, wherein the at least one layer of inorganic film is a silicon nitride film or a silicon oxide film.

4. The method according to claim 1, wherein the first organic layer comprises a hole injection layer and a hole transport layer, and wherein the hole injection layer breaks at the etching angle when forming the hole injection layer.

5. The method according to claim 1, wherein the forming the pixel defining layer on the at least one layer of inorganic film comprises:
   patterning the pixel defining layer to form a plurality of openings and a plurality of pixel spacers.

6. The method according to claim 1, wherein the etching angle is in a range of about 70 degrees to about 135 degrees.

7. An OLED device comprising:
   a substrate;
   a first electrode layer disposed on the substrate;

at least one layer of inorganic film disposed on the first electrode layer at a position corresponding to a pixel defining layer, wherein the at least one layer of inorganic film has a preset etching angle;

the pixel defining layer disposed on the at least one layer of inorganic film;

a first organic layer directly contacting the first electrode layer at a position not corresponding to the pixel defining layer, and directly contacting the pixel defining layer, wherein the first organic layer is broken at the preset etching angle of the at least one layer of inorganic film; and a light emitting layer, a second organic layer, and a second electrode layer disposed in this order on the first organic layer.

8. The OLED device according to claim 7, wherein the at least one layer of inorganic film is a silicon nitride film or a silicon oxide film.

9. The OLED device according to claim 7, wherein the preset etching angle is in a range of about 70 degrees to about 135 degrees.

10. The OLED device according to claim 7, wherein the first electrode layer is an indium tin oxide/silver/indium tin oxide composite layer.

11. A display panel comprising the OLED device according to claim 7.

12. The display panel according to claim 11, wherein the at least one layer of inorganic film is a silicon nitride film or a silicon oxide film.

13. The display panel according to claim 11, wherein the preset etching angle is in a range of about 70 degrees to about 135 degrees.

14. The display panel according to claim 11, wherein the first electrode layer is an indium tin oxide/silver/indium tin oxide composite layer.

* * * * *